(12) United States Patent
Wang et al.

(10) Patent No.: US 9,543,415 B2
(45) Date of Patent: Jan. 10, 2017

(54) THIN FILM TRANSISTOR DRIVING BACKPLANE AND MANUFACTURING METHOD THEREOF, AND DISPLAY PANEL

(71) Applicant: BOE TECHNOLOGY GROUP CO., LTD., Beijing (CN)

(72) Inventors: Zuqiang Wang, Beijing (CN); Chien Hung Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 293 days.

(21) Appl. No.: 14/362,971

(22) PCT Filed: Dec. 12, 2013

(86) PCT No.: PCT/CN2013/089180
§ 371 (c)(1),
(2) Date: Jun. 5, 2014

(87) PCT Pub. No.: WO2015/043084
PCT Pub. Date: Apr. 2, 2015

(65) Prior Publication Data
US 2016/0218124 A1   Jul. 28, 2016

(30) Foreign Application Priority Data
Sep. 27, 2013   (CN) .......................... 2013 1 0451705

(51) Int. Cl.
*H01L 21/00* (2006.01)
*H01L 31/062* (2012.01)
(Continued)

(52) U.S. Cl.
CPC ....... *H01L 29/66757* (2013.01); *H01L 27/124* (2013.01); *H01L 27/1259* (2013.01);
(Continued)

(58) Field of Classification Search
CPC ....................... H01L 29/66757; H01L 27/1288
(Continued)

(56) References Cited

U.S. PATENT DOCUMENTS 7,015,122 B2 * 3/2006 Lee ......................... H01L 27/12
257/E21.413
7,235,850 B2 * 6/2007 Koo ..................... H01L 29/4908
257/291
(Continued)

FOREIGN PATENT DOCUMENTS

CN       1011319585 A       2/2008
CN        101335188 A      12/2008
(Continued)

OTHER PUBLICATIONS

First Office Action issued by State Intellectual Property Office of the People's Republic of China dated Jul. 9, 2014, 4pgs.
(Continued)

*Primary Examiner* — Calvin Lee
(74) *Attorney, Agent, or Firm* — Ladas & Parry LLP (57) ABSTRACT

The embodiments of the present invention provide a thin film transistor driving backplane and a manufacturing method thereof, and a display panel. The manufacturing method may comprise: manufacturing a backplane base disposed with a plurality of active device structures; disposing an electrode layer on the backplane base; and manufacturing the electrode layer into a source electrode, a drain electrode and a pixel electrode integrally disposed with the drain electrode by one patterning process. According to the embodiment of the present invention, the electrode layer is manufactured into a plurality of source electrodes, drain electrodes and pixel electrodes, integrally disposed with the drain electrode, by one time patterning process, so that the source electrode, the drain electrode and the pixel electrode are all at the same electrode layer, and the source electrode,
(Continued)

the drain electrode and the pixel electrode whose formation needs two patterning processes in the existing method, is simplified to one time patterning process, so it reduces the thickness of the thin film transistor driving backplane, simplifies the manufacturing step, and saves the manufacturing cost.

13 Claims, 7 Drawing Sheets

(51) Int. Cl.
  H01L 29/66 (2006.01)
  H01L 27/12 (2006.01)
  H01L 49/02 (2006.01)
  H01L 45/00 (2006.01)

(52) U.S. Cl.
  CPC .......... *H01L 27/1288* (2013.01); *H01L 28/88* (2013.01); *H01L 45/1691* (2013.01)

(58) Field of Classification Search
  USPC ..... 438/28, 34, 486, 697, 717; 257/291, 258
  See application file for complete search history.

(56) References Cited

U.S. PATENT DOCUMENTS

| 7,402,950 B2* | 7/2008 | Park | H01L 27/3276 |
| | | | 313/498 |
| 7,994,706 B2* | 8/2011 | Choi | H01L 27/3248 |
| | | | 313/504 |
| 2008/0111484 A1 | 5/2008 | Kwon et al. | |
| 2009/0004878 A1 | 1/2009 | Ohnuma et al. | |
| 2012/0146031 A1 | 6/2012 | Lee | |
| 2013/0001579 A1 | 1/2013 | Jung et al. | |

FOREIGN PATENT DOCUMENTS

| CN | 102569665 A | 7/2012 |
| CN | 102636327 A | 8/2012 |
| CN | 102854682 A | 1/2013 |
| CN | 203445123 U | 2/2014 |

OTHER PUBLICATIONS

English translation of First Office Action issued by State Intellectual Property Office of the People's Republic of China dated Jul. 9, 2014, 4pgs.
International Search Report for International Application No. PCT/CN2013/089180, 16pgs.
Second Office Action issued by State Intellectual Property Office of the People's Republic of China for Chinese Application No. CN201310451705.0, dated Nov. 14, 2014, 6pgs.
English translation of Second Office Action issued by State Intellectual Property Office of the People's Republic of China for Chinese Application No. CN201310451705.0, dated Jul. 9, 2014, 4pgs.
Third Office Action issued by State Intellectual Property Office of the People's Republic of China for Chinese Application No. CN201310451705.0, dated Feb. 28, 2015, 4pgs.
English translation of Third Office Action issued by State Intellectual Property Office of the People's Republic of China for Chinese Application No. CN201310451705.0, dated Feb. 28, 2015, 4pgs.
English Abstract of CN101335188A (listed above); 1 pg.
International Preliminary Report on Patentability issued Mar. 29, 2016; PCT/CN2013/089180.

\* cited by examiner

THIN FILM TRANSISTOR DRIVING BACKPLANE AND MANUFACTURING METHOD THEREOF, AND DISPLAY PANEL

CROSS REFERENCE TO RELATED APPLICATIONS

This application is based on International Application No. PCT/CN2013/089180 filed on Dec. 12, 2013, which claims priority to Chinese National Application No. 201310451705.0 filed on Sep. 27, 2013. The entire contents of each and every foregoing application are incorporated herein by reference.

TECHNICAL FIELD

Embodiments of the present invention relate to a field of display technology, and in particular, to a thin film transistor driving backplane and a manufacturing method thereof, and a display panel.

BACKGROUND

As people's living standard is improved, the people's requirement on display quality is getting higher and higher, and liquid crystal display (LCD) has been very mature, and LCD may be found in cellular phone, camera, computer, television and so on. People's large demands on the display product objectively push the development of display technology, and new display technologies appear continually. Active matrix organic light emitting diode (AMOLED) panel is called as a next generation display technology, and companies such as Samsung Electronics, LG and Philips pay much attention to this new display technology. Currently, Samsung Electronics, LG and Philips take a development of large size AMOLED panel product as the main direction, and Samsung SDI, AU Optronics and so on take medium and small size as the development direction. This is because that AMOLED has better performance than TFT LCD in terms of picture quality, efficiency and cost. However, current AMOLED panel, especially the thin film transistor driving backplane used to drive the panel to display image, its manufacturing process mainly forms desired patterns required by thin film transistor and other devices on various thin film layers therein by patterning process, thus this requires to perform multiple patterning processes, and generally it needs seven or more patterning processes to complete the manufacturing, and the fund required by each patterning process is very expensive. Thus, with respect to the manufacturing of the thin film transistor driving backplane, reducing the times of patterning processes is a difficult problem which restricts its development.

SUMMARY

Embodiments of the present invention provide a thin film transistor driving backplane and a manufacturing method thereof, and a display panel, which may simplify the manufacturing steps and save manufacturing cost by a design of manufacturing the electrode layer into a plurality of source electrodes, drain electrodes and pixel electrode, integrally disposed with the drain electrode, by one patterning process.

An embodiment of the present invention provides a manufacturing method of a thin film transistor driving backplane, the method comprising: manufacturing a backplane base disposed with a plurality of active device structures; disposing an electrode layer on the backplane base; and manufacturing the electrode layer into a source electrode, a drain electrode and a pixel electrode integrally disposed with the drain electrode by one patterning process.

The method may further comprise: sequentially forming a pixel definition layer and an spacer pillar on a layer where the source electrode, the drain electrode and the pixel electrode are located.

In an embodiment, a material of the electrode layer may be one of metal material and oxide transparent electrode material.

In an embodiment, manufacturing the backplane base may comprise the following steps: disposing a semiconductor layer on a base substrate; fabricating the semiconductor layer into an active channel by a mask and photolithography process; disposing a gate insulation layer on the active channel; disposing a gate layer on the gate insulation layer; fabricating the gate layer into a gate electrode by mask and photolithography process; disposing an isolation protection layer on the gate electrode; disposing an interlayer dielectric layer on the isolation protection layer; and forming a contact hole in the isolation protection layer, the interlayer dielectric layer, and the gate insulation layer by a mask and photolithography process.

In an embodiment, the step of disposing an isolation protection layer on the gate electrode may comprise: disposing a layer of metal thin film on the gate electrode; and oxidizing the metal thin film as the isolation protection layer by an oxidizing process.

In an embodiment, the step of disposing a semiconductor layer on a base substrate may comprise: disposing a buffer layer on the base substrate; disposing an amorphous silicon thin film on the buffer layer; performing dehydrogenation treatment on the amorphous silicon thin film; performing Excimer laser annealing treatment on the amorphous silicon thin film, to convert the amorphous silicon thin film into a poly silicon thin film, and the poly silicon thin film is the semiconductor layer.

In an embodiment, the active channel comprises a source contact region, a drain contact region and a channel connecting region disposed between the source contact region and the drain contact region. The step of fabricating the semiconductor layer into an active channel by mask and photolithography process may comprise: performing dopant injection on the active channel by ion injection process, during the injection, injecting dopant respectively into the source contact region and the drain contact region by using the gate electrode as the mask; and activate the dopant by activating process.

An embodiment of the present invention further provide a thin film transistor driving backplane, which may be manufactured by the above manufacturing method of a thin film transistor driving backplane. The thin film transistor driving backplane may comprise a backplane base disposed with a plurality of active device structures, and a source electrode, a drain electrode and a pixel electrode, disposed integrally with the drain electrode, disposed on the backplane base.

In an embodiment, the backplane base may comprise a base substrate, and a plurality of active channels, a gate insulation layer, a plurality of gate electrodes, an isolation protection layer and an interlayer dielectric layer are sequentially disposed on the base substrate, and a plurality of contact holes are formed in the isolation protection layer, the interlayer dielectric layer and the gate insulation layer to electrically connect the source electrode and the drain electrode to the active channels, respectively.

An embodiment of the present invention further provides a display panel, comprising the above described thin film transistor driving backplane.

In the manufacturing method, the thin film transistor driving backplane, and the display panel according to the embodiments of the present invention, a design of manufacturing the electrode layer into a plurality of source electrodes, drain electrodes and pixel electrode integrally disposed with the drain electrode by one time patterning process is adopted, so that the source electrode, the drain electrode and the pixel electrode are at the same electrode layer, which cause the reliability of the structure higher, and reduce the thickness of the thin film transistor driving backplane; in the prior art, the source electrode, the drain electrode and the pixel electrode needs two times patterning process, however, it is simplified that it only needs one time patterning process to form simultaneously, so that it may effectively reduce the times of patterning process, simplify the manufacturing steps and save the manufacturing cost.

DETAILED DESCRIPTION

First Embodiment

Figure 1:
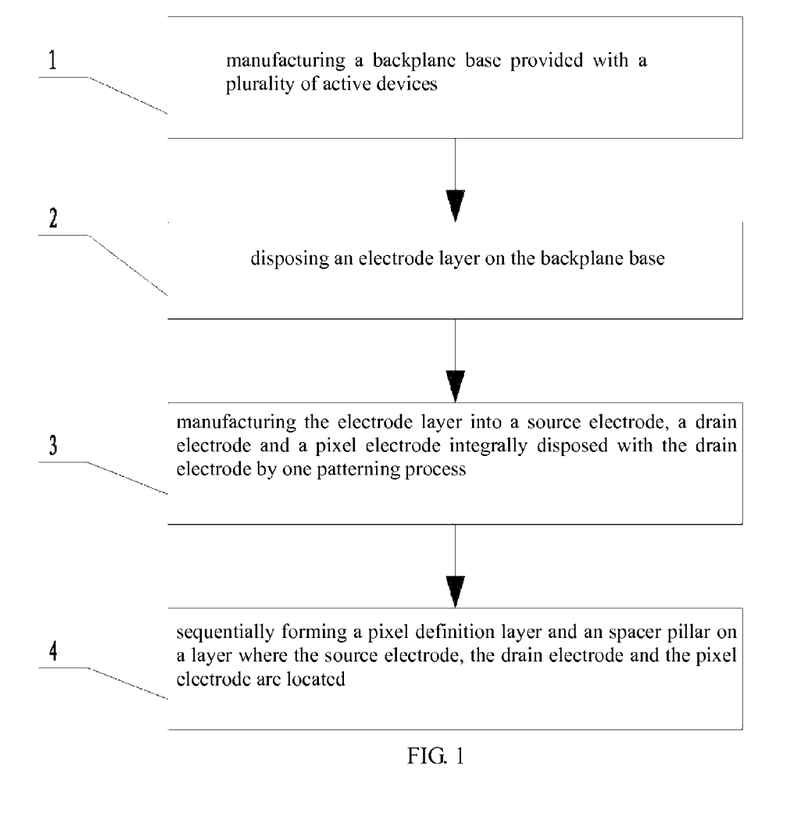
FIG. 1 is a flowchart view of the manufacturing method according to an embodiment of the present invention.

As illustrated in FIG. 1, the first embodiment of the present invention provides a manufacturing method of a thin film transistor driving backplane, and the method may comprise the following steps:

Step 1: manufacturing a backplane base disposed with a plurality of active device structures, wherein the backplane base may comprise a base substrate, a semiconductor layer, a gate insulation layer, a gate layer, an isolation protection layer, an interlayer dielectric layer and a contact hole, and a plurality of active channels may be formed by the semiconductor layer, a plurality of gate electrodes may be formed by the gate layer, and each active channel and the gate electrode, which corresponds to the active channel in position, constitute an active device structure.

Manufacturing the backplane base may comprise the following steps in detail:

(1) disposing a semiconductor layer on the base substrate.

Figure 2:
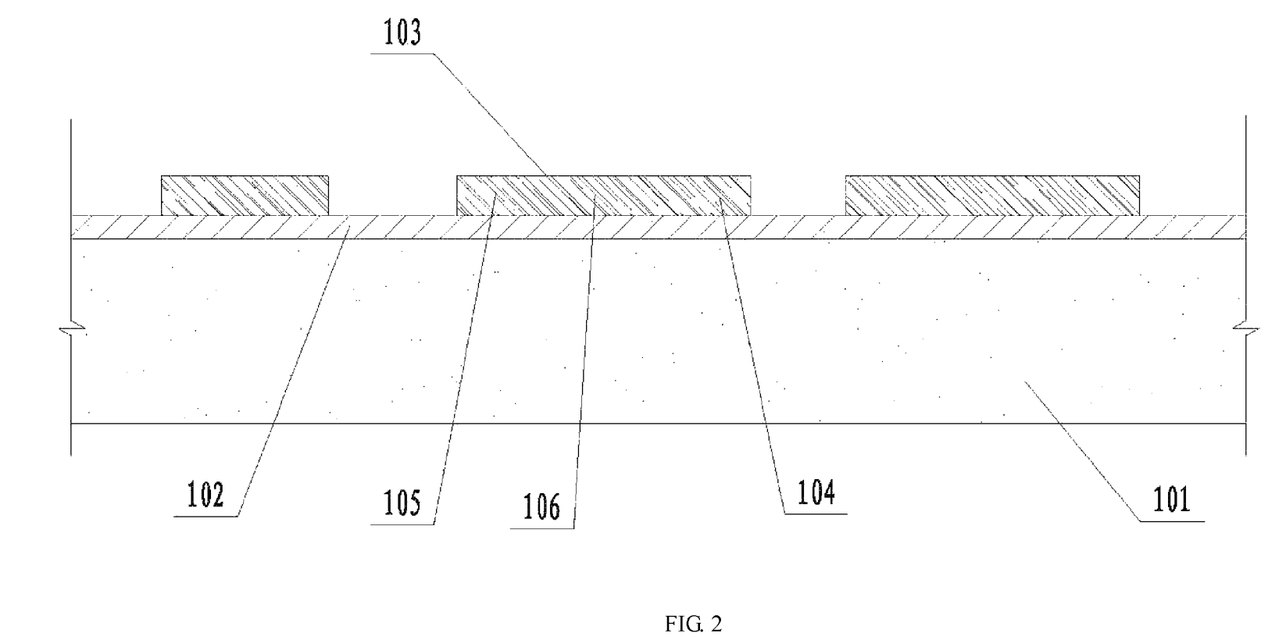
FIGS. 2 to 7 are schematic cross sectional views illustrating respective stages in the manufacturing method according to an embodiment of the present invention.

As illustrated in FIG. 2, a cleaning treatment is performed on the base substrate 101, and a buffer layer 102 is disposed on the base substrate by plasma enhancing chemical vapor deposition method, wherein the base substrate may be constituted by transparent material with good light transmittance such as glass, transparent plastics, and so on, and the buffer layer may be formed by sequentially disposing a silicon oxide material layer and a silicon nitride material layer or manufactured by a composite layer of a silicon oxide material layer and a silicon nitride material layer, wherein the thickness of the silicon oxide material layer may be 50-100 nm, and the thickness of the silicon nitride material layer may be 100300 nm; the composite layer of a silicon oxide material layer and a silicon nitride material layer refers to a complex type material layer simultaneously having the two types material layers of the silicon oxide material layer and the silicon nitride material layer which are manufactured by one manufacturing process.

An amorphous silicon thin film is disposed on the buffer layer by plasma enhancing chemical vapor deposition method, wherein the thickness of the amorphous silicon thin film may be about 40-50 nm; the base substrate is transferred into a high temperature furnace, and a dehydrogenation treatment is performed on the amorphous silicon thin film, to achieve the goal of reducing the hydrogen content in the amorphous silicon thin film, wherein the hydrogen content is generally controlled to be less than 2%; and an excimer laser annealing treatment is performed on the amorphous silicon thin film, to convert the amorphous silicon thin film into a poly silicon thin film, and the poly silicon thin film is the semiconductor layer.

Figure 3:
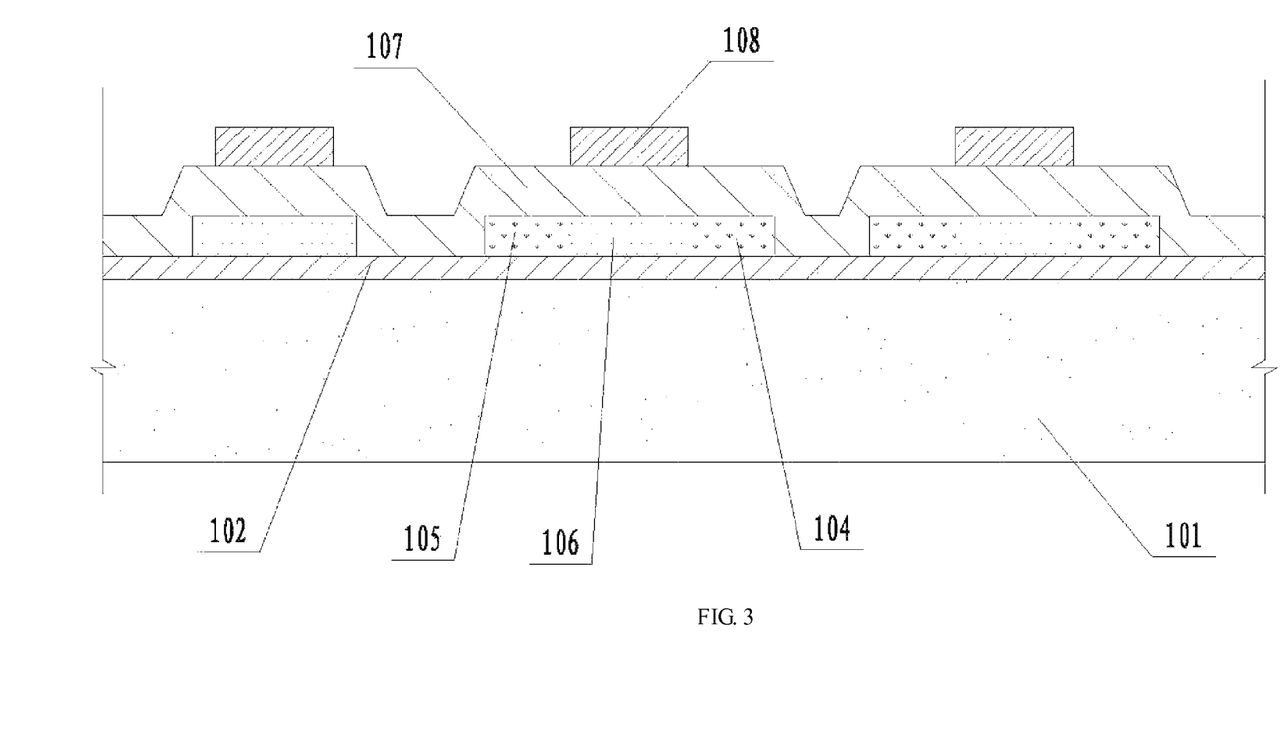

(2) fabricating the semiconductor layer into a plurality of active channels by mask and photolithography process. As illustrated in FIG. 3, a plurality of active channels 103 may be formed from the semiconductor layer by such patterning process of mask and photolithography process, wherein each active channel 103 may comprise a source contact region 104, a drain contact region 105, and a channel connecting region 106 disposed between the source contact region 104 and the drain contact region 105. The mask and photolithography process may comprise procedures such as coating photoresist, disposing mask plate, exposing, developing, etching, photoresist lifting off and so on. Then, dopant injection may be performed on the active channel by ion injection process. During the injection, a gate electrode which is later formed above the channel connecting region may be used as the mask, so as to achieve self-alignment; dopants are respectively injected into the semiconductor layer at the source contact region and the drain contact region, so as to form the source contact region and the drain contact region having dopant. Subsequently, the dopants in the source contact region and the drain contact region may be activated by an activating process, to make the activated dopant in an ion state to have higher mobility, and make them automatically fill suitable positions in the semiconductor layer at the source contact region and the drain contact region, to repair crystal defect therein. The dopant may be divided into P type dopant and N type dopant; the corresponding different dopant may cause the active channel to have different property, that is, the thin film transistor driving backplane of the present invention may comprise such two types: N type thin film transistor and/or P type thin film transistor, and each type of thin film transistor may comprise an active channel, a gate electrode, a source electrode connected on the source contact region, and a drain electrode connected on the drain contact region.

(3) disposing a gate insulation layer on the active channel. As illustrated in FIG. 3, the gate insulation layer 107 may be disposed on the active channel by plasma enhancing chemical vapor deposition method, wherein the gate insulation layer 107 may be a composite layer of silicon oxide material layer and silicon nitride material layer, wherein a thickness of the silicon oxide material layer is 50-100 nm, and a thickness of the silicon nitride material layer is 40-80 nm. The gate insulation layer 107 may be used to block the gate electrode and the active channel in respective thin film transistors, so that electrical signal crosstalk would not occur when they operate.

(4) disposing a gate layer on the gate insulation layer. In some embodiments, the gate layer may be disposed on the gate insulation layer by magnetron controlled sputtering process. The gate layer may be fabricated by one metal of Mo, W, Ti, Cr or the like, or be fabricated by an alloy formed by any combination of the above various elements.

(5) fabricating gate electrodes from the gate layer by mask and photolithography process. As illustrated in FIG. 3, a plurality of gate electrodes 108 may be fabricated from the gate layer by such patterning process of mask and photolithography process. So far, a plurality of complete active device structures comprising the active channels and the gate electrodes have been formed on the base substrate.

Figure 4:
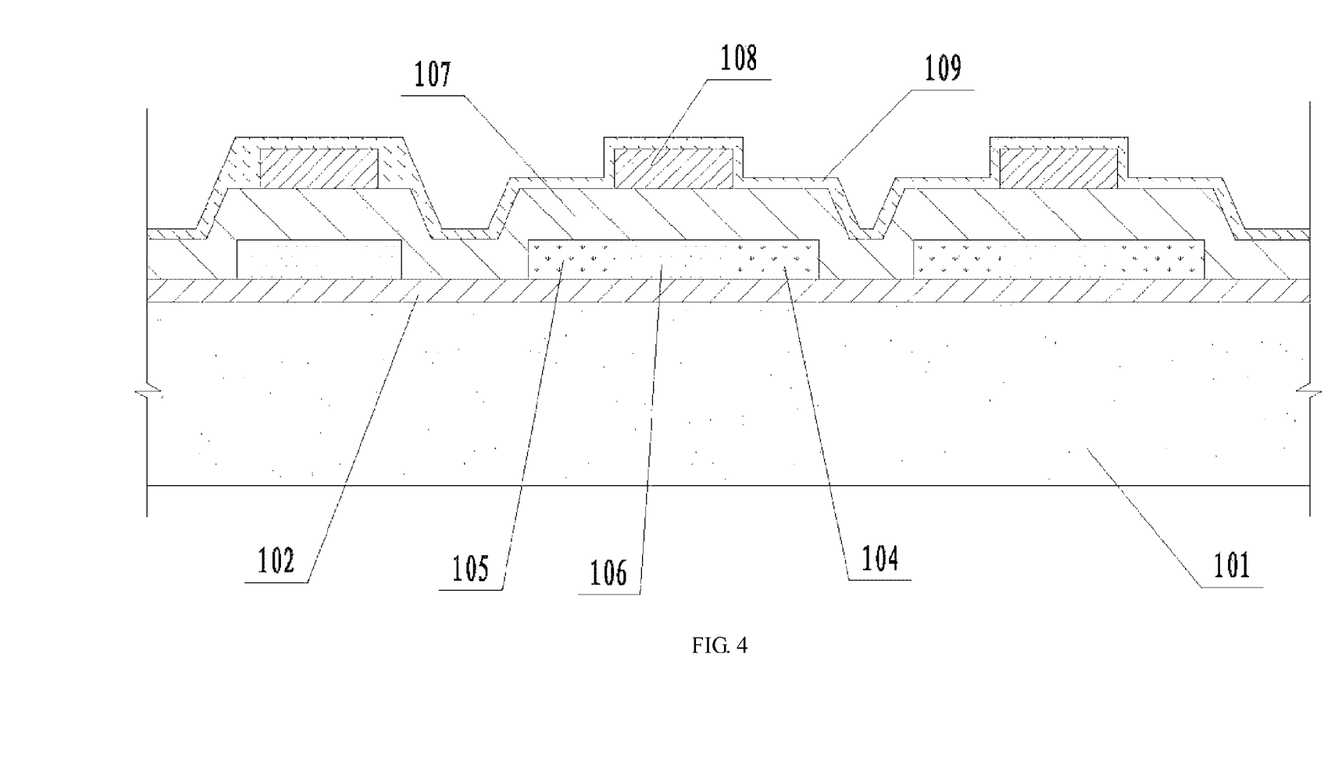

(6) disposing an isolation protection layer on the gate electrodes. As illustrated in FIG. 4, disposing the isolation protection layer 109 on the plurality of gate electrodes 108 may comprise in detail:

disposing a layer of metal thin film on the gate electrode by magnetron controlled sputtering process, wherein the metal thin film is fabricated by using metal material which is easy to be oxidized, such as aluminum, and the following will give an explanation by taking the metal thin film whose material is aluminum, as an example.

oxidizing the metal thin film layer whose material is aluminum, into this nonmetal thin film of aluminum oxide thin film by oxidizing process, wherein the nonmetal thin film is the isolation protection layer, to play a function of isolating and protecting the gate electrodes of various thin film transistor structures in the backplane base, so as to improve the stability of various thin film transistor structures. The oxidizing process may adopt one of high temperature oxygen furnace oxidizing treatment and oxygen plasma oxidizing treatment. The reacting temperature of the high temperature oxygen furnace oxidizing treatment may be between 260° C. to 320° C., and preferably 300° C.

Figure 5:
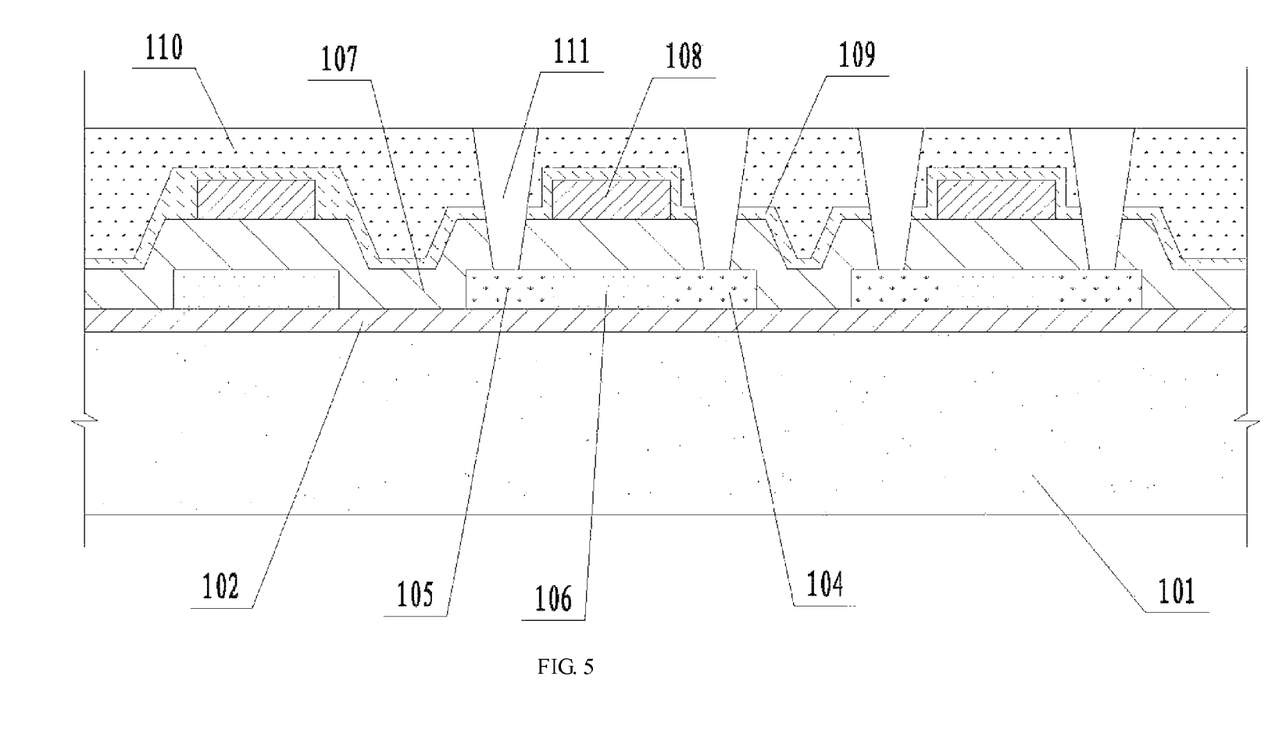

(7) disposing an interlayer dielectric layer on the isolation protection layer. As illustrated in FIG. 5, in some embodiments, the interlayer dielectric layer 110 may be disposed on the isolation protection layer by PECVD method. The interlayer dielectric layer 110 may be a complex layer of silicon oxide material layer and silicon nitride material layer.

(8) forming contact holes in the isolation protection layer, the interlayer dielectric layer and the gate insulation layer by mask and photolithography process. As illustrated in FIG. 5, in some embodiments, a plurality of contact holes 111 may be formed in the interlayer dielectric layer 110, the isolation protection layer 109 and the gate insulation layer 107 by mask and photolithography. The contact holes 111 may penetrate the interlayer dielectric layer 110, the isolation protection layer 109 and the gate insulation layer 107, and reach the source contact region and the drain contact region of the active channel. So far, the manufacturing of the backplane base is complete.

In addition, alternatively, high temperature annealing treatment may be performed on the backplane base. Since the buffer layer, the gate insulation layer and the interlayer dielectric layer in the backplane base are all fabricated by silicon nitride material layer, the high temperature annealing treatment may diffuse hydrogen in these layers (hydrogenation) to play a function of repairing hydrogen dangling bonding in the silicon nitride material layer.

Step 2: disposing an electrode layer on the backplane base.

In some embodiments, the electrode layer may be disposed on the interlayer dielectric layer of the backplane base by magnetron controlled sputtering process. The material of the electrode layer may be any one of metal materials such as aluminum, titanium, silver and so on or oxide transparent electrode materials, or manufactured by an alloy constituted by any several metals such as the above aluminum, titanium, silver. The oxide transparent electrode layer may be materials such as indium tin oxide, indium zinc oxide, indium gallium zinc oxide and so on. When the thin film transistor driving backplane is used to manufacture a bottom-emitting type display panel, the electrode layer may use oxide transparent electrode material, to cause the light to be reflected downward via the cathode of the display panel manufactured by metal material, and transmit the electrode layer made by the oxide transparent electrode material, and emit out from the bottom surface of the display panel. When the thin film transistor driving backplane is used to manufacture a top-emitting type display panel, the electrode layer may use metal material, to cause the light to be reflected upward, and transmit the cathode of the display panel which is made by oxide transparent electrode layer, and emit out from the upper surface of the display panel. No matter the top-emitting type display panel or the bottom-emitting type display panel, its operating principle and construction both belong to the prior art, and it is not repeated here.

Figure 6:
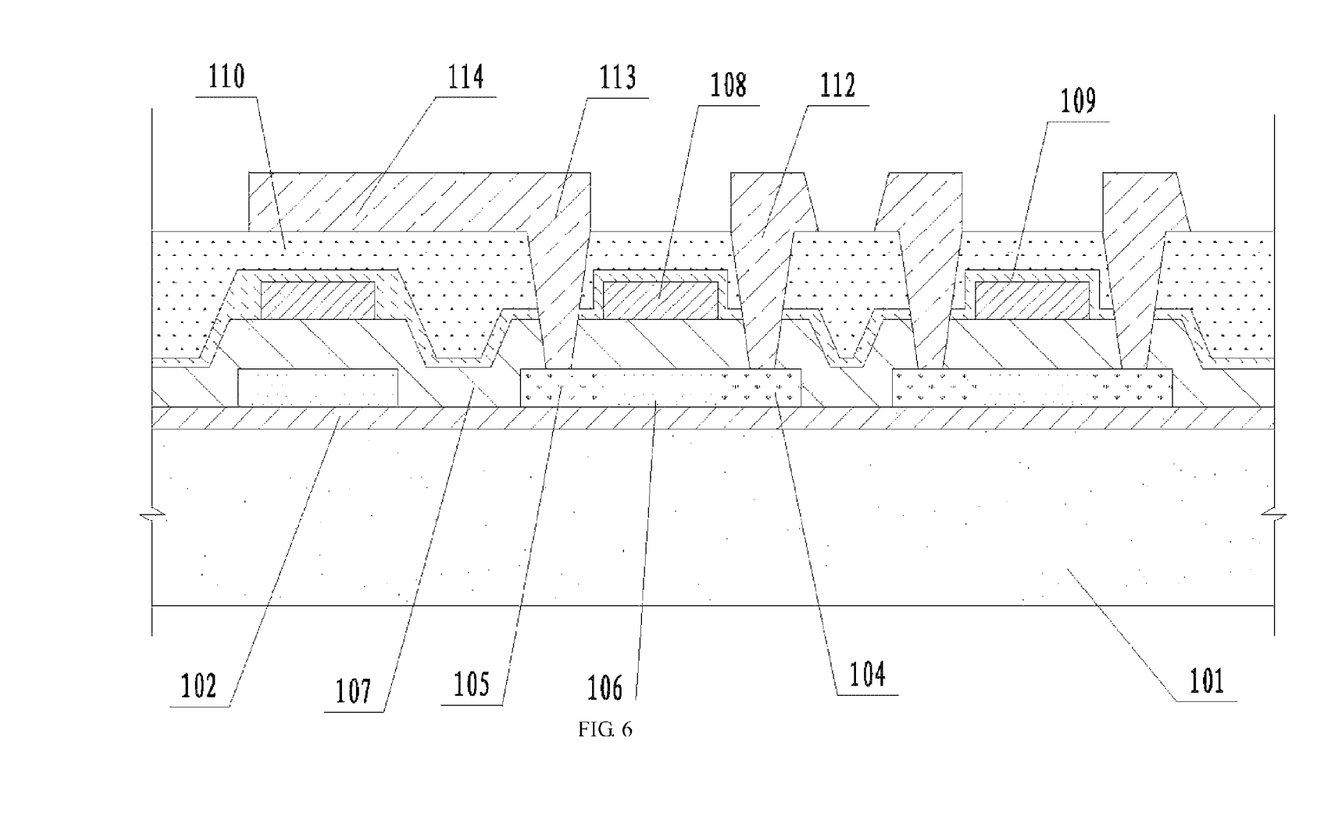

Step 3: as illustrated in FIG. 6, manufacturing the electrode layer into a plurality of source electrodes 112, drain electrodes 113 and pixel electrode 114 integrally disposed with the drain electrode 113 by one patterning process. In an embodiment of the present invention, the source electrode, the drain electrode and the pixel electrode may share the same layer structure, that is, located in the same layer and formed simultaneously by the same material. The patterning process may be a mask and photolithography process, and the mask and photolithography process may comprise steps of exposing, developing, etching, lifting off and so on. In detail, according to the layout of the predesigned respective source electrode, drain electrode and the pixel electrode, the source electrode, drain electrode and the pixel electrode are formed simultaneously by performing etching on the electrode layer; since the pixel electrode is connected with the drain electrode in the current thin film transistor driving backplane, it needs to form the pixel electrode and the drain electrode integrally. In the present embodiment, the source electrode and the drain electrode are both connected with the active channel in respective active device structures in the backplane base by the contact holes, and the respective active device structures comprises a gate electrode and an active channel, wherein the gate electrode may be correspondingly disposed above the active channel, and correspond to the position of the channel connecting region in the active channel.

Figure 7:
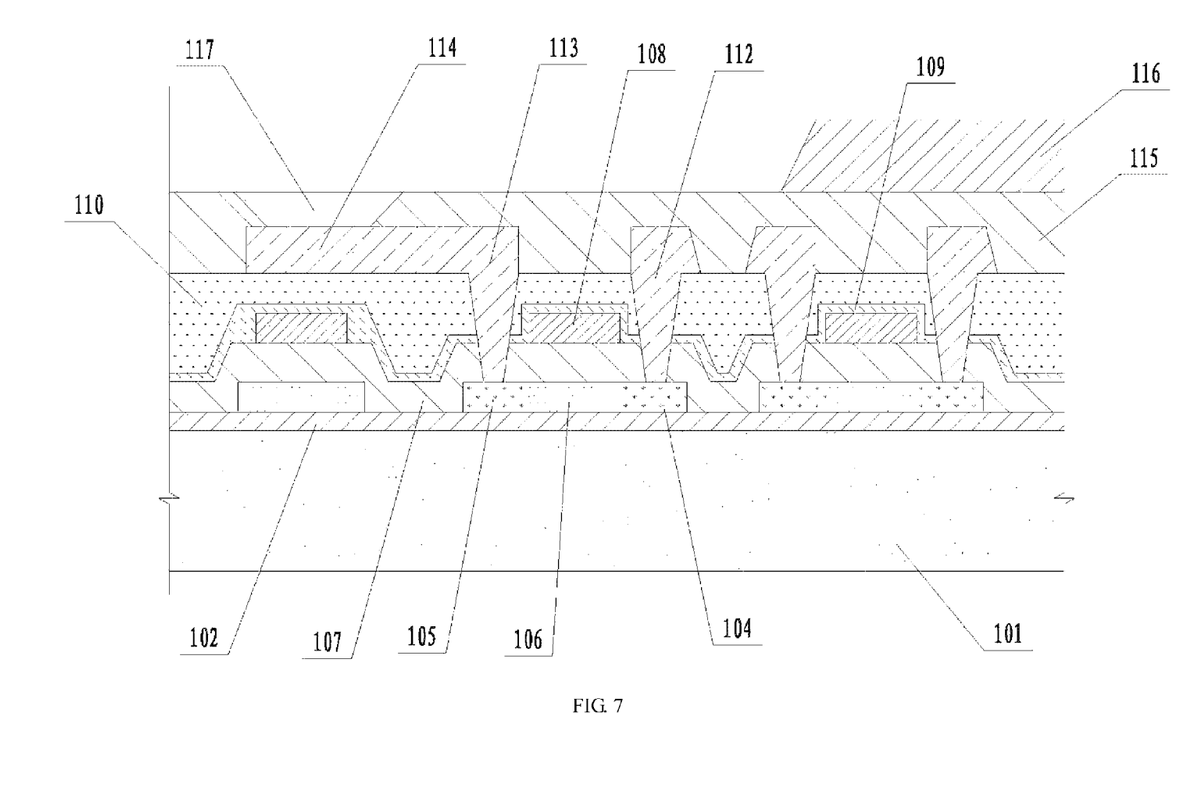

Step 4: as illustrated in FIG. 7, sequentially forming a pixel definition layer 115 and a spacer pillar 116 on the layer where the source electrode, drain electrode and the pixel electrode are located, by a patterning process. So far, the manufacturing of the thin film transistor driving backplane of the embodiment of the present invention is complete. The structure of the pixel definition layer and the spacer pillar and their manufacturing procedure described in the embodiment all belong to the prior art, and it is not repeated here.

The mask and photolithography process, heat annealing process, plasma enhancing chemical vapor deposition method, activation process, ion injection process, high temperature annealing treatment, excimer laser annealing treatment, magnetron controlled sputtering process, dehydrogenation treatment and oxidizing process described in the embodiment of the present invention are all conventional processes, and thus the present invention does not give detailed description on the above various processes.

The manufacturing method of the embodiment of the present invention adopts the design of manufacturing the electrode layer into a plurality of source electrodes, drain electrodes and pixel electrode integrally disposed with the drain electrode by one patterning process, so that the source electrode, the drain electrode and the pixel electrode are at the same electrode layer; the source electrode, the drain electrode and the pixel electrode, which needs two patterning process in the prior art, only needs one patterning process to be fabricated, so that it greatly reduces the thickness of the thin film transistor driving backplane, simplifies the manufacturing steps, and saves the manufacturing cost.

It is to be noted that all the source electrodes and the drain electrodes in the embodiment of the present invention are not differentiated, that is, the source electrode may be called as the drain electrode, and correspondingly, at this time, the drain electrode may also be called as the source electrode.

Second Embodiment

The second embodiment of the present invention provides a thin film transistor driving backplane, which may be manufactured by the manufacturing method described in the first embodiment. Thus, the second embodiment may comprise the technical content disclosed in the first embodiment, and it is not repeated here.

As illustrated in FIG. 7, the thin film transistor driving backplane may comprise a backplane base and an electrode layer disposed on the backplane base, wherein a plurality of source electrodes, drain electrodes and pixel electrodes disposed integrally with the drain electrode are formed in the electrode layer.

In the present embodiment, the backplane base may comprise a base substrate, and a semiconductor having a plurality of active channels, a gate insulation layer, a gate layer having a plurality of gate electrodes, an isolation protection layer and an interlayer dielectric layer are sequentially disposed on the base substrate, and a plurality of contact holes are formed in the interlayer dielectric layer and the isolation protection layer. In the present embodiment, it may manufacture the electrode layer into a pattern having a source electrode, a drain electrode and a pixel electrode by one time patterning process, the pixel electrode is disposed on the interlayer dielectric layer, and one side of the pixel electrode is connected with the top end of the drain electrode as one body.

In the present embodiment, each active device structures may comprise one active channel and a gate electrode disposed above the active channel.

In the present embodiment, the active channel may comprise a source contact region, a drain contact region and a channel connecting region disposed between the source contact region and the drain contact region, wherein the gate electrode may be correspondingly disposed on the channel connecting region.

In the present embodiment, contact holes may be disposed on the respective source contact regions and respective drain contact regions, and the contact holes penetrate the interlayer dielectric layer and the isolation protection layer.

In the present embodiment, the lower end of the drain electrode may extend into the contact hole and connect with the drain contact region, and the lower end of the source electrode may extend into the contact hole and connect with the source contact region.

In the present embodiment, a buffer layer may be disposed between the base substrate and the semiconductor layer. A pixel definition layer may be disposed on the electrode layer, and a notch 117 corresponding to the pixel electrode is disposed on the pixel definition layer, to facilitate the conduction of the pixel electrode and the organic electroluminescence layer of the AMOLED panel. In the present embodiment, a spacer pillar 116 may be disposed on the pixel definition layer 115.

The present invention does not give restriction on the plotting scale in FIG. 7, that is, the thin film transistor driving backplane illustrated in FIG. 7 is only used to be schematic, and does not give any restriction on the parameters of the detailed spec dimension and proportion and so on.

Third Embodiment

The third embodiment of the present invention provides a display panel, which comprises the above described thin film transistor driving backplane base.

The display panel may be active matrix organic light emitting diode panel, and may also be active type matrix liquid crystal display. The display panel may be a top-emitting type display panel, and the top-emitting type display panel refers to that the thin film transistor driving backplane emits upward the light forming the image by using the electrode layer made from metal material, and the light emits out by the top surface of the display panel. The detailed structure and principle of the top-emitting type display panel in the present embodiment belong to the prior art, and it is not repeated here.

In particular, since the thin film transistor driving backplane only needs to provide high reflectivity required by reflecting the light, and it does not need to have high transmittance and does not have requirement on its aperture ratio, so the pixel electrode on the thin film transistor driving backplane may also use the same metal material as the source electrode and the drain electrode or manufactured by oxide transparent electrode material, and this provides a precondition for forming the pixel electrode, the source electrode and the drain electrode at the same electrode layer by one time. However, in the existing thin film transistor driving backplane, it generally forms a layer of metal electrode layer by one patterning process by using the source electrode and the drain electrode, and then disposes a layer of transparent electrode layer having the pixel electrode on the metal electrode layer by a second patterning process, and this not only increases the thickness of the thin film transistor driving backplane, but also it needs two time patterning process to respective fabricate, which causes the manufacturing step complicate and increases the manufacturing cost. Thus, the thin film transistor driving backplane and the display panel according to the embodiments of the present invention both adopt the design that the source electrode, the drain electrode and the pixel electrode are disposed in the same electrode layer and the drain electrode is integrally formed with the pixel electrode, so that its structure has higher reliability, and it reduces the thickness of the thin film transistor driving backplane; moreover, the source electrode, the drain electrode and the pixel electrode may be formed simultaneously by one patterning process, and it may effectively reduce the times of the patterning process, simplify the manufacturing step, and save the manufacturing cost.

What is claimed is:

1. A manufacturing method of a thin film transistor driving backplane, the method comprising:
   manufacturing a backplane base provided with a plurality of active device structures;
   disposing an electrode layer on the backplane base;
   manufacturing the electrode layer into a source electrode, a drain electrode and a pixel electrode integrally disposed with the drain electrode by one patterning process, wherein the source electrode, the drain electrode and the pixel electrode are located in a same layer; and sequentially forming a pixel definition layer and a spacer pillar on a layer whereat the source electrode, the drain electrode and the pixel electrode located.

2. The manufacturing method of claim 1, wherein a material of the electrode layer is one of metal material and oxide transparent electrode material.

3. The manufacturing method of claim 1, wherein manufacturing the backplane base comprises the following steps:
disposing a semiconductor layer on a base substrate;
fabricating the semiconductor layer into an active channel by a mask and photolithography process;
disposing a gate insulation layer on the active channel;
disposing a gate layer on the gate insulation layer;
fabricating the gate layer into a gate electrode by mask and photolithography process;
disposing an isolation protection layer on the gate electrode;
disposing an interlayer dielectric layer on the isolation protection layer; and
forming a contact hole in the isolation protection layer, the interlayer dielectric layer, and the gate insulation layer by a mask and photolithography process.

4. The manufacturing method of claim 1, wherein a material of the electrode layer is one of metal material and oxide transparent electrode material.

5. The manufacturing method of claim 4, wherein manufacturing the backplane base comprises the following steps:
disposing a semiconductor layer on a base substrate;
fabricating the semiconductor layer into an active channel by a mask and photolithography process;
disposing a gate insulation layer on the active channel;
disposing a gate layer on the gate insulation layer;
fabricating the gate layer into a gate electrode by mask and photolithography process;
disposing an isolation protection layer on the gate electrode;
disposing an interlayer dielectric layer on the isolation protection layer; and
forming a contact hole in the isolation protection layer, the interlayer dielectric layer, and the gate insulation layer by a mask and photolithography process.

6. The manufacturing method of claim 1, wherein manufacturing the backplane base comprises the following steps:
disposing a semiconductor layer on a base substrate;
fabricating the semiconductor layer into an active channel by a mask and photolithography process;
disposing a gate insulation layer on the active channel;
disposing a gate layer on the gate insulation layer;
fabricating the gate layer into a gate electrode by mask and photolithography process;
disposing an isolation protection layer on the gate electrode;
disposing an interlayer dielectric layer on the isolation protection layer; and
forming a contact hole in the isolation protection layer, the interlayer dielectric layer, and the gate insulation layer by a mask and photolithography process.

7. The manufacturing method of claim 6, wherein disposing the isolation protection layer on the gate electrode comprises:
disposing a layer of metal thin film on the gate electrode; and
oxidizing the metal thin film as the isolation protection layer by an oxidizing process.

8. The manufacturing method of claim 6, wherein disposing the semiconductor layer on the base substrate comprises:
disposing a buffer layer on the base substrate;
disposing an amorphous silicon thin film on the buffer layer;
performing a dehydrogenation treatment on the amorphous silicon thin film; and
performing an excimer laser annealing treatment on the amorphous silicon thin film, to convert the amorphous silicon thin film into a poly silicon thin film, wherein the poly silicon thin film is the semiconductor layer.

9. The manufacturing method of claim 6, wherein the active channel comprises a source contact region, a drain contact region and a channel connecting region disposed between the source contact region and the drain contact region,
wherein fabricating the semiconductor layer into the active channel by the mask and photolithography process comprise:
performing dopant injection on the active channel by an ion injection process, wherein during the injection, dopants are respectively injected into the source contact region and the drain contact region by using the gate electrode as the mask; and
activating the dopant by an activating process.

10. A thin film transistor driving backplane, which is manufactured by the manufacturing method of claim 1, wherein the thin film transistor driving backplane comprises a backplane base provided with a plurality of active device structures, and a source electrode, a drain electrode, and a pixel electrode disposed on the backplane base, the pixel electrode being disposed integrally with the drain electrode and the source electrode, the drain electrode, and the pixel electrode located in a same layer.

11. The thin film transistor driving backplane of claim 10, wherein the backplane base comprises a base substrate, and a plurality of active channels, a gate insulation layer, a plurality of gate electrodes, an isolation protection layer and an interlayer dielectric layer are sequentially disposed on the base substrate, and a plurality of contact holes are formed in the isolation protection layer, the interlayer dielectric layer and the gate insulation layer to electrically connect the source electrode and the drain electrode to the active channel, respectively.

12. A display panel, comprising the thin film transistor backplane of claim 10.

13. The display panel of claim 12, wherein the backplane base comprises a base substrate, and a plurality of active channels, a gate insulation layer, a plurality of gate electrodes, an isolation protection layer and an interlayer dielectric layer are sequentially disposed on the base substrate, and a plurality of contact holes are formed in the isolation protection layer, the interlayer dielectric layer and the gate insulation layer to electrically connect the source electrode and the drain electrode to the active channel, respectively.

* * * * *